United States Patent
Onishi

(10) Patent No.: US 8,502,365 B2
(45) Date of Patent: Aug. 6, 2013

(54) SEMICONDUCTOR DEVICE AND POWER SEMICONDUCTOR DEVICE

(75) Inventor: Kazuaki Onishi, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 13/052,021

(22) Filed: Mar. 18, 2011

(65) Prior Publication Data

US 2011/0272797 A1  Nov. 10, 2011

(30) Foreign Application Priority Data

May 10, 2010  (JP) ................................. 2010-107971

(51) Int. Cl.
*H01L 29/04* (2006.01)

(52) U.S. Cl.
USPC .......................................... 257/678; 257/727

(58) Field of Classification Search
USPC ................. 257/723, 704, 691, 787, 790, 678, 257/727
See application file for complete search history.

(56) References Cited

U.S. PATENT DOCUMENTS

| | | | | |
|---|---|---|---|---|
| 5,646,445 A | * | 7/1997 | Masumoto et al. | 257/723 |
| 5,825,085 A | * | 10/1998 | Masumoto et al. | 257/704 |
| 2003/0151128 A1 | * | 8/2003 | Kawaguchi | 257/691 |
| 2006/0202323 A1 | * | 9/2006 | Shinohara | 257/706 |
| 2007/0215999 A1 | * | 9/2007 | Kashimoto et al. | 257/678 |
| 2007/0235860 A1 | * | 10/2007 | Steger et al. | 257/706 |
| 2010/0078807 A1 | * | 4/2010 | Schulz | 257/713 |

FOREIGN PATENT DOCUMENTS

| | | |
|---|---|---|
| CN | 201239880 | 5/2009 |
| JP | 2008-243970 | 10/2008 |
| JP | 2009-095102 | 4/2009 |

OTHER PUBLICATIONS

Chinese Office Action dated May 6, 2013, issued in Chinese counterpart Application No. 201110066544.4, 20 pages. (with translation).

* cited by examiner

*Primary Examiner* — S. V. Clark
(74) *Attorney, Agent, or Firm* — Patterson & Sheridan, LLP

(57) ABSTRACT

According to one embodiment, a semiconductor device includes a casing, a semiconductor element, a terminal and a screw member. The semiconductor element is housed within the casing. The terminal is electrically connected to the semiconductor element, and has an externally projecting part extending out of the casing. The screw member is movably provided along a surface of the casing between the externally projecting part and the casing, and fixes an external terminal to the externally projecting part.

20 Claims, 6 Drawing Sheets

SEMICONDUCTOR DEVICE AND POWER SEMICONDUCTOR DEVICE

CROSS-REFERENCE TO RELATED APPLICATIONS

This application is based upon and claims the benefit of priority from the prior Japanese Patent Application No. 2010-107971, filed on May 10, 2010; the entire contents of which are incorporated herein by reference.

FIELD

Embodiments described herein relate generally to a semiconductor light emitting device and a power semiconductor device.

BACKGROUND

Semiconductor devices include a semiconductor element, a casing that houses the semiconductor element, and a terminal electrically connected to the semiconductor element. The semiconductor element is, for example, a transistor or a diode. The casing houses the semiconductor element that is provided on a substrate. The terminal is electrically connected to the semiconductor element within the housing, and extends outside the casing.

A hole is provided in an externally projecting part of the terminal provided outside of the casing. This hole is for connecting the externally projecting part to an external connection member (for example a bus bar) with a bolt and nut. The nut is embedded in the casing at a position aligned with the hole of the externally projecting part. In this way, the external connection member is connected to the externally projecting part by the bolt and nut (see for example, JP-A 2008-243970 (kokai)).

However, when attaching the external connection member such as a bus bar or the like to the semiconductor device, it is difficult to align the external connection member and the nut on the casing side, so much labor is required to attach the external connection member.

DETAILED DESCRIPTION

Figure 1A:
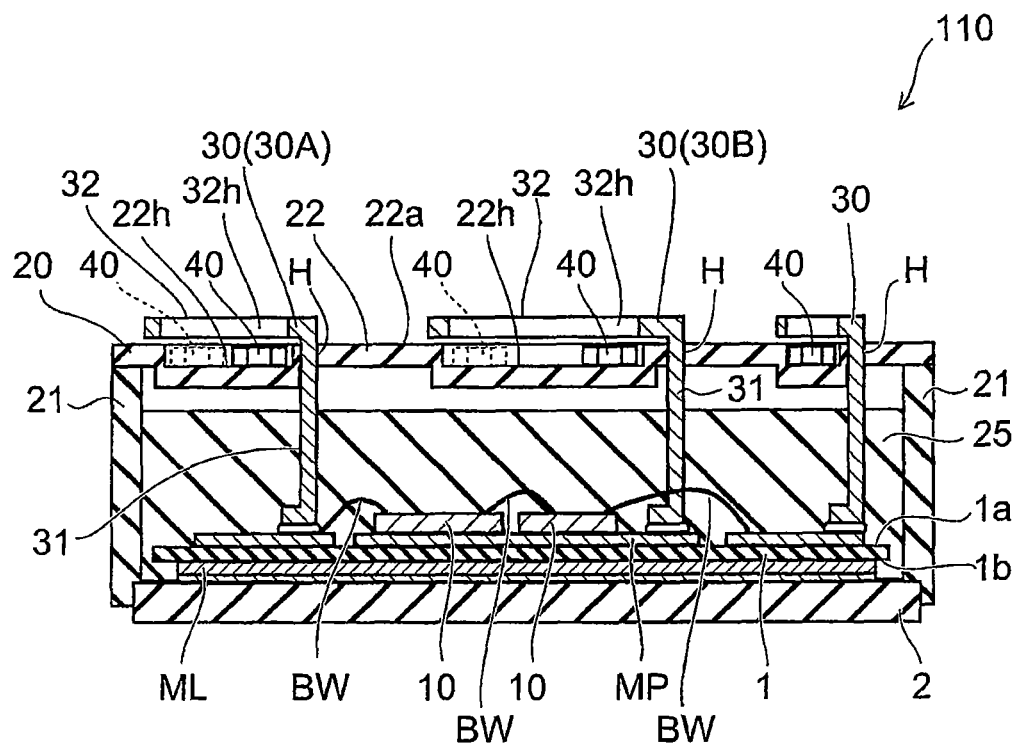
FIGS. 1A and 1B are schematic views illustrating the configuration of a semiconductor device according to a first embodiment.

In general, according to one embodiment, a semiconductor device includes a casing, a semiconductor element, a terminal and a screw member. The semiconductor element is housed within the casing. The terminal is electrically connected to the semiconductor element, and has an externally projecting part extending out of the casing. The screw member is movably provided along a surface of the casing between the externally projecting part and the casing, and fixes an external terminal to the externally projecting part.

In general, according to another embodiment, a power semiconductor device includes a power transistor, a casing, a first terminal, a second terminal, a third terminal and a screw member. The power transistor is mounted on a substrate. The casing houses the power transistor in the casing. The first terminal is electrically connected to a first electrode of the power transistor, the second terminal is electrically connected to a second electrode of the power transistor, and the third terminal is electrically connected to a third electrode of the power transistor. Each of the first terminal, the second terminal and the third terminal has an externally projecting part extending out of the casing. The screw member is movably provided along a surface of the casing between at least one externally projecting part of the first terminal, the second terminal and the third terminal and the casing. The screw member fixes an external terminal to the externally projecting part.

Various embodiments will be described hereinafter with reference to the accompanying drawings.

Note that the drawings are schematic or simplified illustrations and that relationships between thickness and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to constituents that have already appeared in the drawings and have been described, and repetitious detailed descriptions of such constituents are omitted.

(First Embodiment)

Figure 1B:
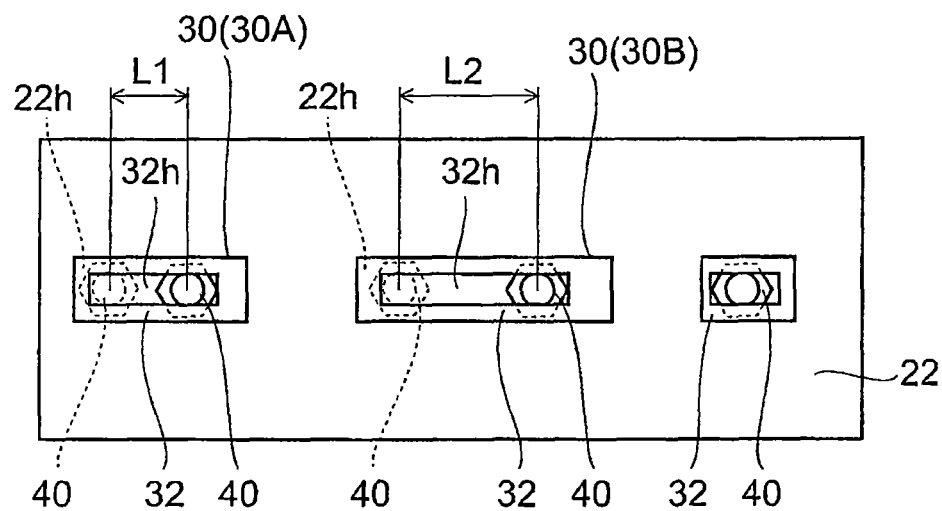

FIGS. 1A and 1B are schematic views illustrating the configuration of a semiconductor device according to a first embodiment.

FIG. 1A is a schematic cross-sectional view of a semiconductor device 110. Also, FIG. 1B is a schematic plan view of the semiconductor device 110.

Figure 2:
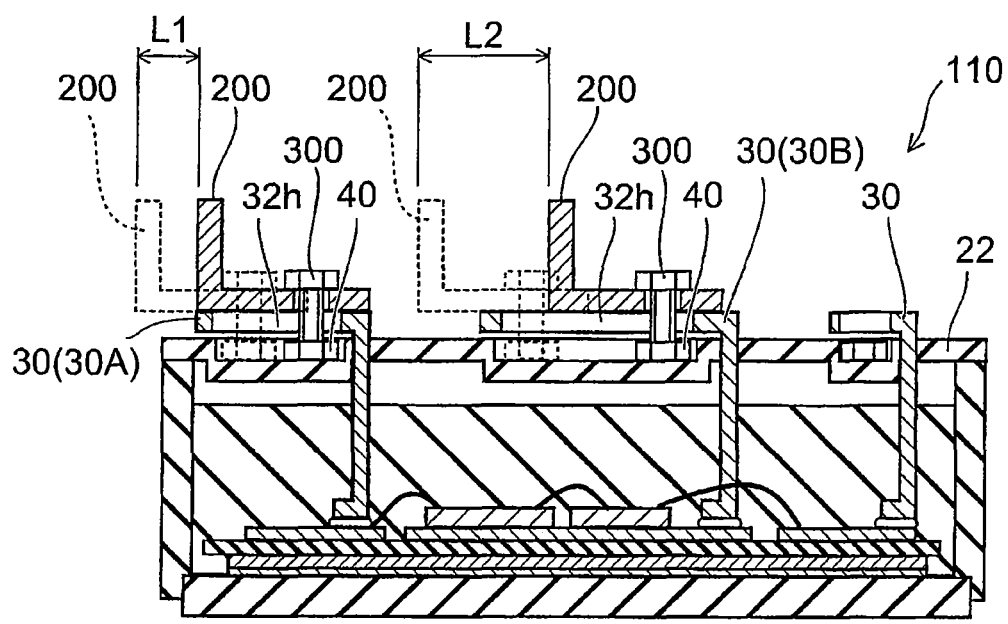
FIG. 2 is a schematic cross-sectional view illustrating a connected state of the external connection member in the semiconductor device according to the first embodiment.

FIG. 2 is a schematic cross-sectional view illustrating a connected state of the external connection member in the semiconductor device according to the first embodiment.

As illustrated in FIG. 1A, the semiconductor device 110 according to the embodiment includes a semiconductor element 10, a casing 20, a terminal 30, and a nut 40, which is an example of a screw member.

In the semiconductor device 110, the nut 40 is provided so that it can move along a major surface 22a of a lid 22, which is a part of a surface of the casing 20.

The semiconductor element 10 is, for example, an active element such as a transistor or a diode, or an inactive element such as a resistor or condenser. In the semiconductor device 110 according to the embodiment, an active element such as a transistor or a diode is used as an example of the semiconductor element 10.

The semiconductor element 10 is mounted on an insulating substrate 1. A ceramic substrate, for example, is used as the insulating substrate 1. An electrode pattern MP is formed on a first major surface 1a of the insulating substrate 1. A back face of the semiconductor element 10 is connected to the electrode pattern MP by, for example, solder. Also, an electrode pad (not illustrated) provided on a front face of the semiconductor element 10 is connected to the electrode pattern MP by a bonding wire SW or the like.

A metal film ML is formed over virtually the entire surface of a second major surface 1*b* of the insulating substrate 1. The insulating substrate 1 is connected to a base plate 2 via the metal film ML. The metal film ML and the base plate 2 are connected by, for example, solder. The base plate 2 is made from metal, for example, and is used as a fixing plate for the semiconductor device 110 and as a heat dissipation plate for the semiconductor element 10.

The casing 20 is formed from an insulating material such as, for example, a resin. The casing 20 includes a frame 21 and the lid 22. The frame 21 is, for example, fixed to the base plate 2, and is provided so as to surround the insulating substrate 1. A sealing material 25 made from, for example, silicone resin, is injected inside the frame 21. The sealing material 25 encloses the semiconductor element 10, the bonding wire BW, and so on. The sealing material 25 has a role of protecting the semiconductor element 10 from external influences (for example, humidity, temperature, dust, and external pressure).

The lid 22 is attached to an opening side of the frame 21. The lid 22 is provided with a hole H through which the terminal 30 is allowed to pass. The terminal 30 includes an internally extending part 31 that is electrically connected to the semiconductor element 10 within the casing 20, and an externally projecting part 32 that projects out of the casing 20.

The internally extending part 31 is connected to the electrode pattern MP within the casing 20 by, for example, solder. The internally extending part 31 passes from a connection position with the electrode pattern MP through the hole H in the lid 22, and is connected to the externally projecting part 32.

The externally projecting part 32 projects out of the casing 20. The externally projecting part 32 illustrated in FIGS. 1A and 1B is formed from the same metal plate as the internally extending part 31. The externally projecting part 32 has a portion that is bent approximately normal to the direction of extension of the internally extending part 31. This bent portion is provided along the major surface 22*a* of the lid 22. Here, an elongated hole 32*h* is provided in the externally projecting part 32 aligned with a direction of movement of the nut 40.

The nut 40 has a polygonal profile (i.e., hexagonal or rectangular). The nut 40 is provided so that it can move along the major surface 22*a* of the lid 22 of the casing 20. Here, a groove 22*h* is provided along the major surface 22*a* of the lid 22. The nut 40 is housed within the groove 22*h*, and can move along the direction of extension of the groove 22*h*. In other words, a width of the groove 22*h* is larger than an external diameter of the nut 40, and is of sufficient size that the nut 40 does not rotate within the groove 22*h*. In this way, the nut 40 is provided so that it can move parallel along the groove 22*h*, without rotating within the groove 22*h*.

As illustrated in FIG. 2, the nut 40 is used when connecting the externally projecting part 32 and an external connection member (i.e., a bus bar) 200 with a bolt 300. By providing the nut 40 so that it can move along the major surface 22*a* of the lid 22, the nut 40 has freedom of positioning when fixing the externally projecting part 32 and the external connection member 200 with the bolt 300 and nut 40. In other words, it is possible to provide a margin equal to the range that the nut 40 can move along the major surface 22*a* in the positioning of the bolt 300, or, rather, the attaching position of the external connection member 200. Therefore, the work of attaching the external connection member 200 is facilitated.

In the semiconductor device 110 illustrated in FIGS. 1A and 1B and FIG. 2, three terminals 30 are provided. However, it is sufficient that at least one terminal 30 is provided. If there a plurality of terminals 30 are provided, in the semiconductor device 110 according to the embodiment, it is sufficient that a nut 40 that can move is provided corresponding to at least one terminal 30. In the semiconductor device 110 illustrated in FIGS. 1A and 1B, nuts 40 that can move are provided corresponding to two terminals 30A and 30B of the three terminals 30.

As illustrated in FIG. 1B, the nut 40 corresponding to the terminal 30A can move along the groove 22*h* of the lid 22 within a range L1. Also, the nut 40 corresponding to the terminal 30B can move along the groove 22*h* of the lid 22 within a range L2. In this way, when fixing the external connection member 200 with the bolt 300 and the nut 40, it is possible to align the position of the bolt 300 to the ranges of movement L1 and L2 of the nuts 40.

COMPARATIVE EXAMPLE

Figure 3A:
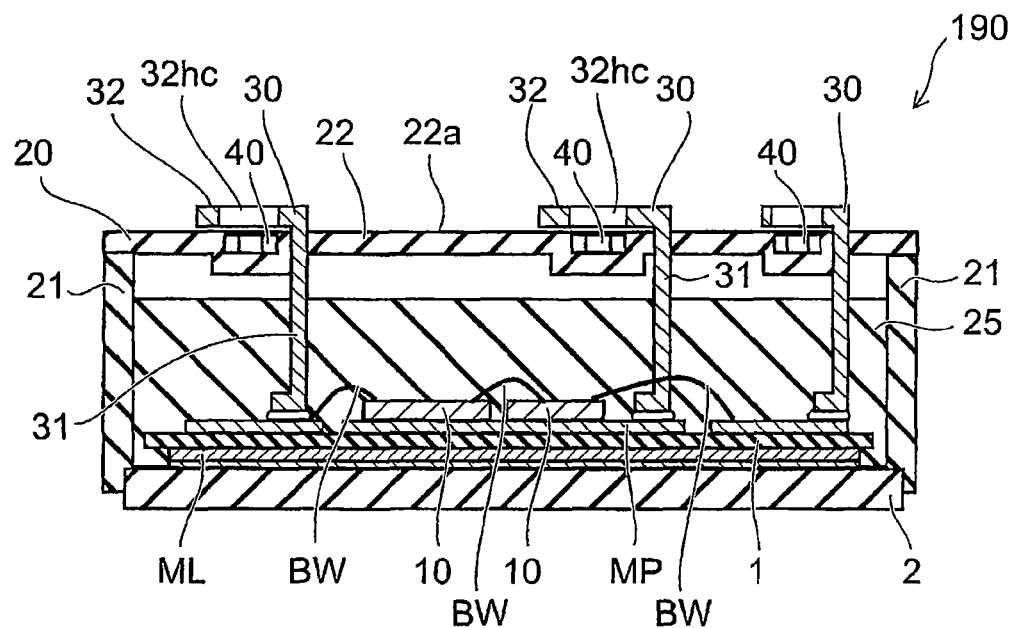
FIGS. 3A and 3B are schematic views illustrating the configuration of a semiconductor device according to a comparative example.
Figure 3B:
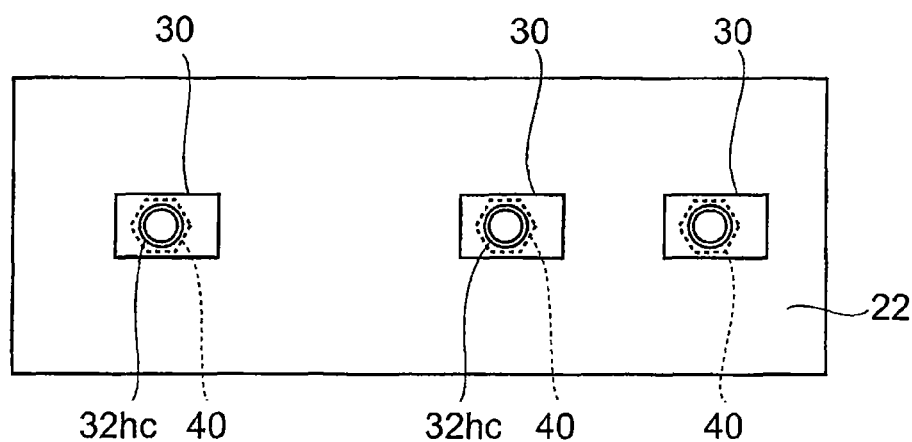

FIGS. 3A and 3B are schematic views illustrating the configuration of a semiconductor device according to a comparative example.

FIG. 3A is a schematic cross-sectional view of a semiconductor device 190 according to the comparative example. Also, FIG. 3B is a schematic plan view of the semiconductor device 190 according to the comparative example.

Figure 4:
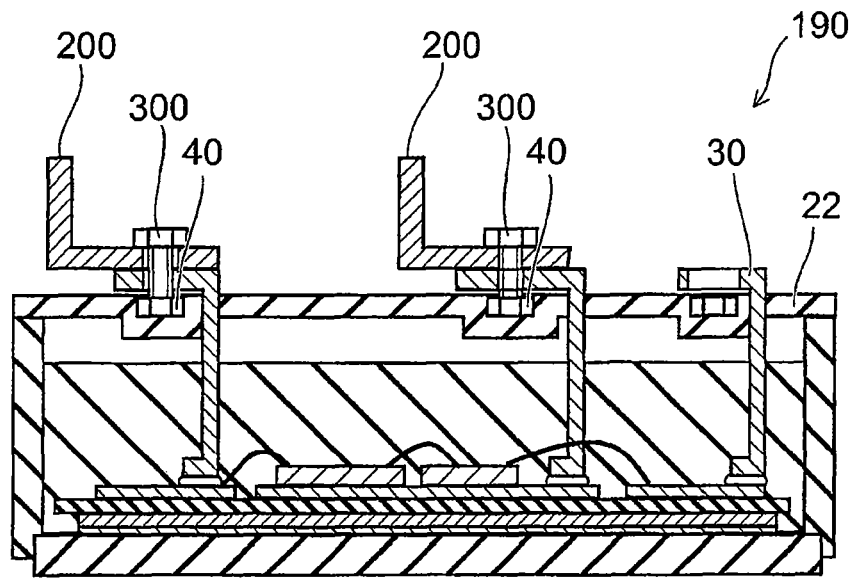
FIG. 4 is a schematic cross-sectional view illustrating a connected state of the external connection member in the semiconductor device according to the comparative example.

FIG. 4 is a schematic cross-sectional view illustrating a connected state of the external connection member in the semiconductor device 190 according to the comparative example.

As illustrated in FIG. 3A, the semiconductor device 190 according to the comparative example includes a semiconductor element 10, a casing 20, a terminal 30, and a nut 40.

In the semiconductor device 190, the nut 40 is embedded in the lid 22 of the casing 20.

The terminal 30 includes an internally extending part 31 that is electrically connected to the semiconductor element 10 within the casing 20, and an externally projecting part 32 that projects out of the casing 20.

The externally projecting part 32 is bent along the major surface 22*a* of the lid 22 outside of the casing 20. A circular hole 32*hc* that is larger than the internal diameter and smaller than the external diameter of the nut 40 is provided in the externally projecting part 32. A position of the circular hole 32*hc* is aligned with the position of the nut 40 embedded in the lid 22.

As illustrated in FIG. 4, the nut 40 is used when connecting the externally projecting part 32 and an external connection member 200 with a bolt 300. In the semiconductor device 190 according to the comparative example, the nut 40 is embedded in the major surface 22*a* of the lid 22. Therefore, when fixing the externally projecting part 32 and the external connection member 200 with the bolt 300 and the nut 40, it is necessary to accurately align the position of the bolt 300 with the position of the nut 40. In other words, there is little freedom in aligning the position of the bolt 300 with the position of the nut 40. If the position of the nut 40 and the position of the bolt 300 are not accurately aligned, it will not be possible to tighten the bolt 300. Aligning the positions of the bolt 300 and nut 40 requires time, so the operation of attaching the external connection member 200 requires much time.

In contrast, in the semiconductor device 110 according to the embodiment, the nut 40 is provided so that it can move along the major surface 22*a* of the lid 22 of the casing 20.

Therefore, when attaching the external connection member 200 with the bolt 300 and the nut 40, there is freedom to align the position of the bolt 300 within the range of movement of the external nut 40. In this way, the operation of attaching the external connection member 200 with the bolt 300 is facilitated.

(Second Embodiment)

Figure 5:
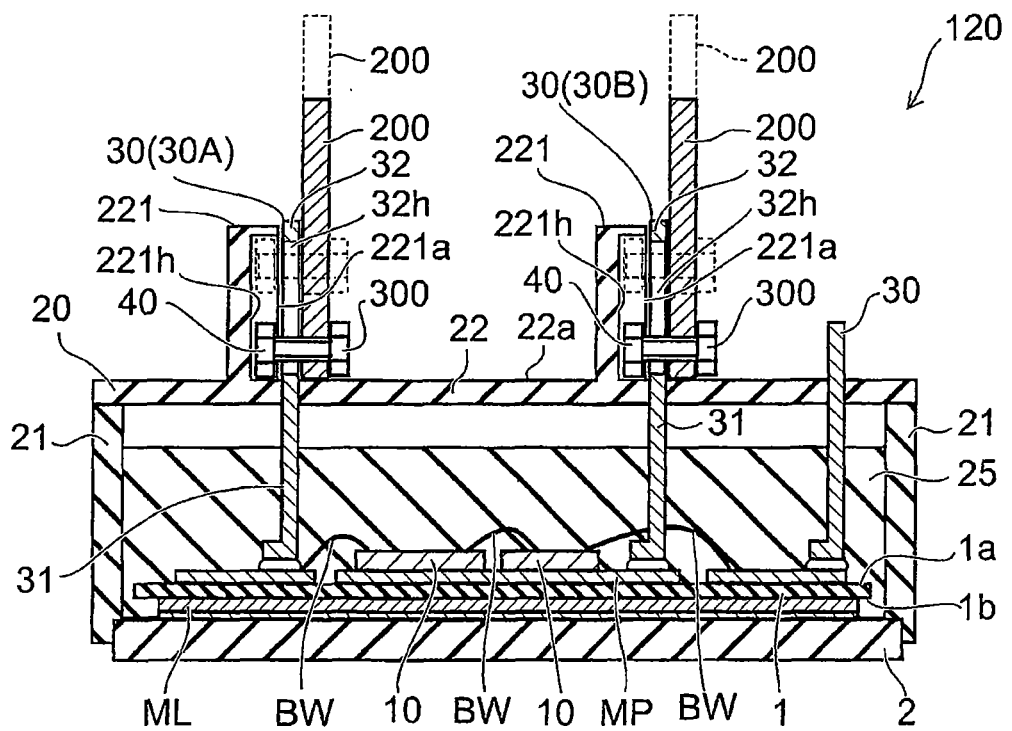
FIG. 5 is a schematic cross-sectional view illustrating the configuration of a semiconductor device according to a second embodiment.

FIG. 5 is a schematic cross-sectional view illustrating the configuration of a semiconductor device according to a second embodiment.

As illustrated in FIG. 5, a semiconductor device 120 according to the second embodiment includes a semiconductor element 10, a casing 20, a terminal 30, and a nut 40, which is a screw member.

The casing 20 includes a first seat 221 provided on a surface of the casing 20. A major surface 221a of the first seat 221 is a part of the surface of the casing 20.

In the semiconductor device 120, the nut 40 is provided so that it can move along the major surface 221a of the first seat 221.

The first seat 221 is provided extending in a direction normal to the major surface 22a of the lid 22. The first seat 221 is, for example, made from the same resin as the lid 22, and, thus, is made integral with the lid 22. The major surface 221a of the first seat 221 is provided along a direction normal to the major surface 22a of the lid 22.

A groove 221h is provided along the major surface 221a of the first seat 221. The nut 40 is housed within the groove 221h. Therefore, the nut 40 is provided so that it can move along the groove 221h. In other words, the nut 40 can move along the major surface 221a (a surface normal to the major surface 22a).

Also, the nut 40 has a polygonal profile (i.e., hexagonal or rectangular). A width of the groove 221h is larger than the external diameter of the nut 40, and is of sufficient size that the nut 40 does not rotate within the groove 221h. In this way, the nut 40 is provided so that it can move parallel along the groove 221h, without rotating within the groove 221h.

The externally projecting part 32 of the terminal 30 extends in a direction normal to the major surface 22a of the lid 22. Also, the externally projecting part 32 is disposed adjacent to a side where the groove 221h of the first seat 221 is provided. In this way, the externally projecting part 32 has a portion that is provided along the major surface 221a of the first seat 221.

In the semiconductor device 120 illustrated in FIG. 5, three of the terminals 30 are provided. However, it is sufficient that at least one terminal 30 is provided. If there are a plurality of terminals 30, in the semiconductor device 120 according to the embodiment, it is sufficient that the first seat 221 is provided corresponding to at least one terminal 30, and the nut 40 that can move is provided in this first seat 221. In the semiconductor device 120 illustrated in FIG. 5, the first seat 221 is provided corresponding to two of the terminals 30A and 30B of the three terminals 30, and the nuts 40 that can move are provided in the first seat 221.

The nut 40 is used when connecting the externally projecting part 32 and an external connection member 200 with the bolt 300. By providing the nut 40 so that it can move along the major surface 221a of the first seat 221, the nut 40 has freedom of positioning when fixing the externally projecting part 32 and the external connection member 200 with the bolt 300 and nut 40.

On the other hand, the elongated hole 32h is provided in the externally projecting part 32 aligned with the direction of movement of the nut 40. The direction of movement of the nut 40 is along the longitudinal axis of the elongated hole 32h. In this way, it is possible to provide a margin equal to the range that the nut 40 can move along the major surface 221a in the positioning of the bolt 300, or, rather, the attaching position of the external connection member 200. Therefore, the work of attaching the external connection member 200 is facilitated.

(Third Embodiment)

Figure 6:
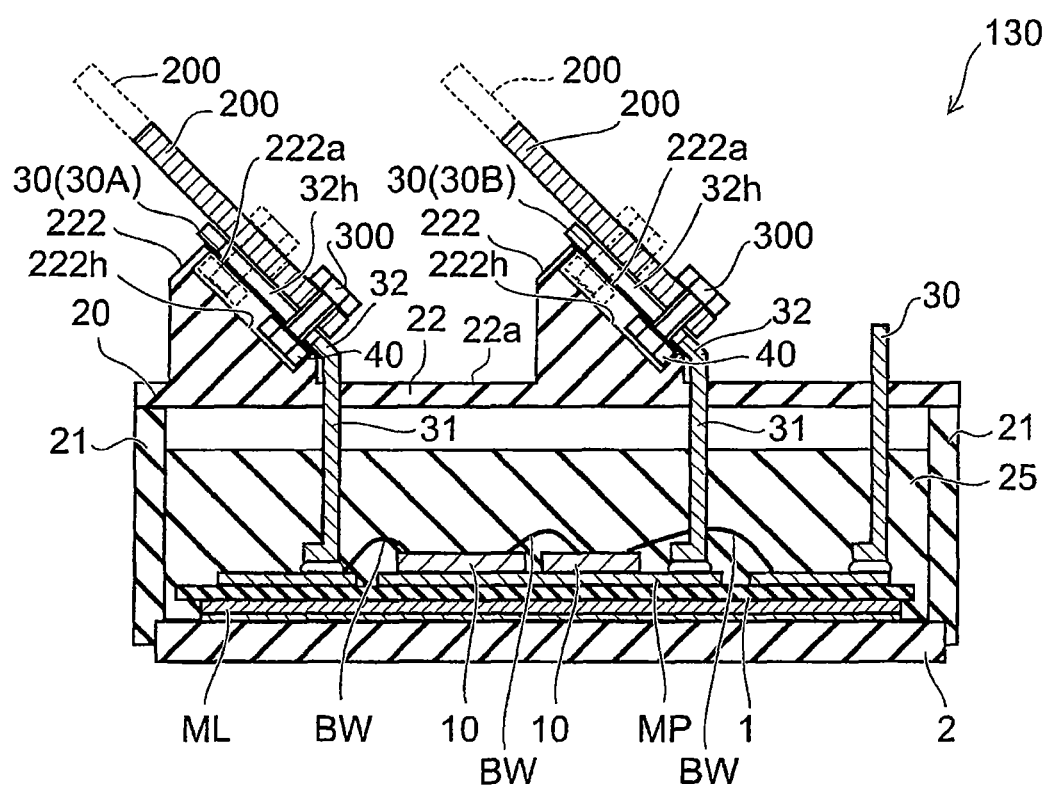
FIG. 6 is a schematic cross-sectional view illustrating the configuration of a semiconductor device according to a third embodiment.

FIG. 6 is a schematic cross-sectional view illustrating the configuration of a semiconductor device according to a third embodiment.

As illustrated in FIG. 6, a semiconductor device 130 according to the third embodiment includes a semiconductor element 10, a casing 20, a terminal 30, and a nut 40, which is a screw member. The casing 20 includes a second seat 222 provided on the surface of the casing 20. A major surface 222a of the second seat 222 is a part of the surface of the casing 20.

In the semiconductor device 130, the nut 40 is provided so that it can move along the major surface 222a of the second seat 222.

The second seat 222 is provided extending in a direction normal to the major surface 22a of the lid 22. The second seat 222 is, for example, made from the same resin as the lid 22, and, thus, is made integral with the lid 22. The major surface 222a of the second seat 222 is provided inclined (i.e., 45°) to the major surface 22a of the lid 22.

A groove 222h is provided along the major surface 222a of the second seat 222. The nut 40 is housed within the groove 222h. Therefore, the nut 40 is provided so that it can move along the groove 222h. In other words, the nut 40 can move along the major surface 222a (a surface normal to the major surface 22a).

Also, the nut 40 has a polygonal profile (i.e., hexagonal or rectangular). A width of the groove 222h is larger than the external diameter of the nut 40, and is of sufficient size that the nut 40 does not rotate within the groove 222h. In this way, the nut 40 is provided so that it can move parallel along the groove 222h, without rotating within the groove 222h.

The externally projecting part 32 of the terminal 30 includes a portion that extends inclined (i.e., 45°) to the major surface 22a of the lid 22. The portion of the externally projecting part 32 that extends inclined is provided along the major surface 222a of the second seat 222 on a side of the second seat 222 where the groove 222h is provided.

In the semiconductor device 130 illustrated in FIG. 6, three of the terminals 30 are provided. However, it is sufficient that at least one terminal 30 is provided. If there are a plurality of terminals 30, in the semiconductor device 130 according to the embodiment, it is sufficient that the second seat 222 is provided corresponding to at least one terminal 30, and the nut 40 that can move is provided in this second seat 222. In the semiconductor device 130 illustrated in FIG. 6, the second seat 222 is provided corresponding to two of the terminals 30A and 30B of the three terminals 30, and nuts 40 that can move are provided in the second seat 222.

The nut 40 is used when connecting the externally projecting part 32 and an external connection member 200 with the bolt 300. By providing the nut 40 so that it can move along the major surface 222a of the second seat 222, the nut 40 has freedom of positioning when fixing the externally projecting part 32 and the external connection member 200 with the bolt 300 and the nut 40.

On the other hand, the elongated hole 32h is provided in the externally projecting part 32 aligned with the direction of movement of the nut 40. The direction of movement of the nut 40 is along the longitudinal axis of the elongated hole 32h. In this way, it is possible to provide a margin equal to the range that the nut 40 can move along the major surface 222a in the positioning of the bolt 300, or, rather, the attaching position of the external connection member 200. Therefore, the work of attaching the external connection member 200 is facilitated.

In the semiconductor device 130 illustrated in FIG. 6, the major surface 222a of the second seat 222 corresponding to the terminals 30A and 30B may be provided at the same angle with respect to the major surface 22a of the lid 22, or they may be provided at different angles. Also, the seat corresponding to the terminal 30 may be provided as a combination of the second seat 222 and the first seat 221 (see FIG. 5).

Also, in the semiconductor devices 110, 120, and 130 according to the embodiments, two or more of the groove 22h (see FIGS. 1A and 1B) provided on the major surface 22a of the lid 22, the groove 221h (see FIG. 5) provided on the first seat 221, and the groove 222h (see FIG. 6) provided on the second seat 222 may be combined as the grooves in which the nuts 40 are disposed. Also, the screw member provided in the grooves 22h, 221h, and 222h may be a bolt instead of the nut 40.

(Fourth Embodiment)

Figure 7A:
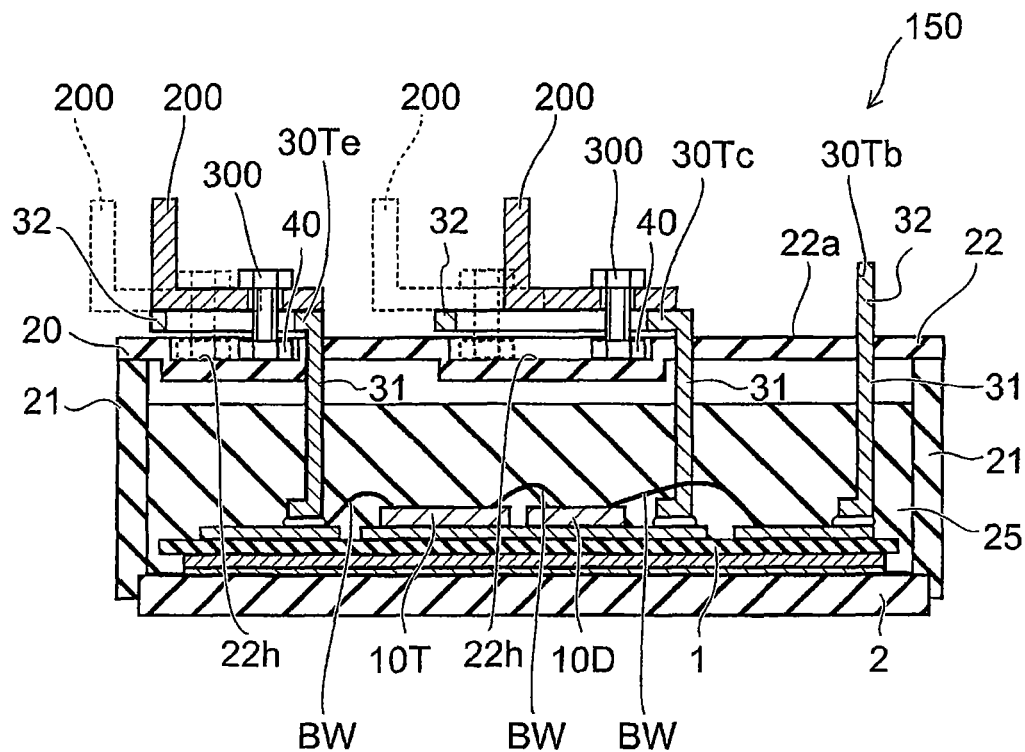
FIGS. 7A and 7B are schematic views illustrating the configuration of a power semiconductor device according to a fourth embodiment.
Figure 7B:
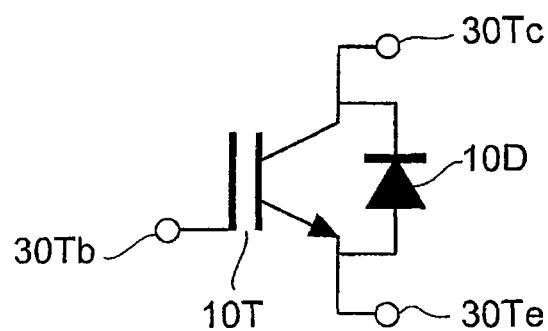

FIGS. 7A and 7B are schematic views illustrating the configuration of a power semiconductor device according to a fourth embodiment.

FIG. 7A is a schematic cross-sectional view of a power semiconductor device 150. FIG. 7B is an equivalent circuit diagram of the power semiconductor device 150.

As illustrated in FIGS. 7A and 7B, the power semiconductor device 150 includes a power transistor 10T, a casing 20, a plurality of terminals 30 (30Te, 30Tc, and 30Tb), and a nut 40, which is a screw member.

The power transistor 10T is a transistor element compatible with high voltages and high currents, such as, for example, an Insulated Gate Bipolar Transistor (IGBT), an Injection Enhanced Gate Transistor (IEGT), or a power metal oxide semiconductor (power-MOS). In the power semiconductor device 150 according to the embodiment, an IGBT is used as an example of the power transistor 10T.

The power transistor 10T is mounted on an insulating substrate 1, for example, a ceramic substrate. An electrode pattern MP is formed on the insulating substrate 1, and the electrode pattern MP is connected to the power transistor 10T by, for example, solder. Also, besides the power transistor 10T, when necessary, a diode 10D is mounted on the insulating substrate 1. The diode 10D is, for example, a Fast Recovery Diode (FRD).

Of the plurality of terminals 30, the terminal 30Tb is connected to, for example, a base, which is a first electrode of the power transistor 10T. The terminal 30Te is connected to, for example, an emitter, which is a second electrode of the power transistor 10T. The terminal 30Tc is connected to, for example, a collector, which is a third electrode of the power transistor 10T. Each terminal 30Te, 30Tc, and 30Tb includes an internally extending part 31 that is electrically connected to the power transistor 10T in the casing 20, and an externally projecting part 32 that projects out of the casing 20.

The nut 40 is provided between the casing 20 and the externally projecting part 32 of at least one of the plurality of terminals 30Te, 30Tc, and 30Tb, and is provided so that it can move along a surface (major surface 20a) of the casing 20. As illustrated in FIGS. 7A and 7B, in the power semiconductor device 150, the nut 40 is provided so that it can move between the casing 20 and the externally projecting part 32 at the terminal 30Te and the terminal 30Tc. In other words, an external connection member (i.e., a bus bar) 200 compatible with high voltages and high current is connected to the terminal 30Te and the terminal 30Tc, using the nut 40 and the bolt 300. On the other hand, high voltage and high current do not flow in the terminal 30Tb, so the wiring is connected via a connector (not illustrated) or the like.

The nut 40 has a polygonal profile (i.e., hexagonal or rectangular). The nut 40 is housed within the groove 22h that is provided along the major surface 22a of the lid 22 of the casing 20. A width of the groove 22h is larger than the external diameter of the nut 40, and is of sufficient size that the nut 40 does not rotate within the groove 22h. In this way, the nut 40 is provided so that it can move parallel along the groove 22h, without rotating within the groove 22h.

By providing the nut 40 so that it can move along the major surface 22a of the lid 22, the nut 40 has freedom of positioning when fixing the externally projecting part 32 and the external connection member 200 with the bolt 300 and nut 40. In other words, it is possible to provide a margin equal to the range that the nut 40 can move along the major surface 22a in the positioning of the bolt 300, or, rather, the attaching position of the external connection member 200. Therefore, the work of attaching the external connection member 200 is facilitated.

In the power semiconductor device 150 illustrated in FIGS. 7A and 7B, a single power transistor 10T is provided within the casing 20, and three terminals 30Te, 30Tc, and 30Tb are provided corresponding to the power transistor 10T. However, a plurality of power transistors 10T may be provided within the casing 20, and a plurality of terminals 30 may be provided corresponding to each power transistor 10T.

Also, in the power semiconductor device 150 according to the embodiment, besides the groove 22h provided on the major surface 22a of the lid 22, the groove 221h (see FIG. 5) provided on the first seat 221, and the groove 222h (see FIG. 6) provided on the second seat 222 may be provided as the grooves in which nuts 40 are disposed. Also, two or more of each of the grooves 22h, 221h, and 222h may be combined. Also, the screw member provided in the grooves 22h, 221h, and 222h may be a bolt instead of the nut 40.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a casing;
   a semiconductor element housed within the casing;
   a terminal electrically connected to the semiconductor element, and having an externally projecting part extending out of the casing; and
   a screw member housed in a groove provided along a surface of the casing, the screw member being slidable along a direction parallel to the groove, and the screw member being configured to fix an external terminal to the externally projecting part.

2. The device according to claim 1, wherein the screw member can move along a longitudinal axis direction of an elongated hole provided in the externally projecting part.

3. The device according to claim 1, wherein the externally projecting part includes a portion extending along the surface of the casing.

4. The device according to claim 1, wherein the externally projecting part includes a portion extending in a direction normal to the surface of the casing.

5. The device according to claim 1, wherein the externally projecting part includes a portion extending at an inclination with respect to the surface of the casing.

6. The device according to claim 1, wherein the terminal further includes an internally extending part electrically connected at one end to the semiconductor element within the casing, and electrically connected at one other end to the externally projecting part.

7. The device according to claim 6, wherein the externally projecting part is bent normal to a direction of extension of the internally extending part.

8. The device according to claim 1, wherein the screw member is a nut that engages with a bolt to fix the external terminal to the externally projecting part.

9. The device according to claim 1, wherein a width of the groove is a size such that the screw member does not rotate within the groove.

10. The device according to claim 1, wherein the casing includes a seat provided on the surface of the casing.

11. The device according to claim 10, wherein the screw member is movably provided along a major surface of the seat.

12. The device according to claim 11, wherein the groove is provided along the major surface of the seat.

13. The device according to claim 11, wherein the externally projecting part is disposed on a side of the seat where the groove is provided.

14. The device according to claim 11, wherein the externally projecting part is provided along the major surface of the seat.

15. The device according to claim 14, wherein the major surface of the seat is provided in a direction normal to the surface of the casing.

16. The device according to claim 14, wherein the major surface of the seat is provided in a direction that is inclined with respect to the surface of the casing.

17. The device according to claim 10, wherein the seat is provided in a plurality, and angles of a major surface of each of the plurality of seats with respect to the surface of the casing are equal.

18. The device according to claim 10, wherein the seat is provided in a plurality, and angles of a major surface of each of the plurality of seats with respect to the surface of the casing are different.

19. A power semiconductor device, comprising:
a power transistor mounted on a substrate;
a casing housing the power transistor in the casing;
a first terminal electrically connected to a first electrode of the power transistor, a second terminal electrically connected to a second electrode of the power transistor, and a third terminal electrically connected to a third electrode of the power transistor, and each of the first terminal, the second terminal and the third terminal having an externally projecting part extending out of the casing; and
a screw member housed in a groove provided along a surface of the casing, the screw member being slidable along a direction parallel to the groove, and the screw member being configured to fix an external terminal to the externally projecting part of one of the first terminal, the second terminal and the third terminal.

20. The power semiconductor device according to claim 19, wherein the screw member is a nut that engages with a bolt to fix the external terminal to the externally projecting part.

* * * * *